United States Patent
Eaton et al.

(10) Patent No.: US 8,779,034 B2
(45) Date of Patent: Jul. 15, 2014

(54) EPOXY RESIN COMPOSITIONS

(75) Inventors: Robert F. Eaton, Belle Mead, NJ (US); James W. Carter, Pearland, TX (US); John M. Beckerdite, Lake Jackson, TX (US)

(73) Assignee: Dow Global Technologies LLC, Midland, MI (US)

( * ) Notice: Subject to any disclaimer, the term of this patent is extended or adjusted under 35 U.S.C. 154(b) by 96 days.

(21) Appl. No.: 13/498,611

(22) PCT Filed: Sep. 29, 2010

(86) PCT No.: PCT/US2010/050615
§ 371 (c)(1),
(2), (4) Date: Mar. 28, 2012

(87) PCT Pub. No.: WO2011/041340
PCT Pub. Date: Apr. 7, 2011

(65) Prior Publication Data
US 2012/0184647 A1 Jul. 19, 2012

Related U.S. Application Data

(60) Provisional application No. 61/247,006, filed on Sep. 30, 2009.

(51) Int. Cl.
*C08L 63/00* (2006.01)
*C08K 3/32* (2006.01)
*C08G 59/24* (2006.01)
*C08G 59/42* (2006.01)

(52) U.S. Cl.
CPC . *C08L 63/00* (2013.01); *C08K 3/32* (2013.01); *C08G 59/24* (2013.01); *C08G 59/4215* (2013.01)
USPC .......................................... 523/451; 524/127

(58) Field of Classification Search
USPC .......................................... 523/451; 524/127
See application file for complete search history.

(56) References Cited

U.S. PATENT DOCUMENTS

| | | | |
|---|---|---|---|
| 3,018,262 A | 1/1962 | Schroeder | |
| 4,328,150 A | 5/1982 | Kondow et al. | |
| 4,686,148 A | 8/1987 | Havens | |
| 5,378,736 A * | 1/1995 | Fujiwa et al. | 522/170 |
| 5,405,688 A | 4/1995 | Decker et al. | |
| 5,411,999 A * | 5/1995 | Gallucci | 523/436 |
| 6,153,719 A | 11/2000 | Abbey et al. | |
| 6,242,083 B1 | 6/2001 | McGrail et al. | |
| 6,512,031 B1 | 1/2003 | Honda et al. | |
| 6,572,971 B2 | 6/2003 | Martin | |
| 6,632,893 B2 | 10/2003 | Konarski et al. | |
| 6,887,574 B2 | 5/2005 | Dean et al. | |
| 7,037,958 B1 | 5/2006 | Hansen et al. | |
| 7,163,973 B2 | 1/2007 | Ahsan | |
| 2005/0171237 A1 | 8/2005 | Patel et al. | |
| 2006/0058473 A1 | 3/2006 | Kawada et al. | |
| 2006/0293172 A1 | 12/2006 | Rubinsztajn et al. | |
| 2009/0118442 A1 | 5/2009 | Tsunashima et al. | |

FOREIGN PATENT DOCUMENTS

| | | | |
|---|---|---|---|
| EP | 403542 | 12/1990 | |
| JP | 11209579 | 8/1999 | |
| JP | 2001049152 A * | 2/2001 | C09D 5/08 |
| WO | 2006052727 | 5/2006 | |

OTHER PUBLICATIONS

XP002611855, Database WPI Week 199651, Thomson Scientific, London, GB; AN 1996-515062, JP 8 269167 (Sumitomo Bakelite Co Ltd) Oct. 15, 1996, abstract.
XP002611856, Database WPI Week 200676, Thomson Scientific, London, GB; AN 2006-732976, JP 2006 200067 A (Dainippon Ink & Chem Inc), Aug. 3, 2006, abstract.
International Search Report and Written Opinion from related PCT application PCT/US2010/050615 dated Dec. 8, 2010, 19 pages.
International Preliminary Report on Patentability from related PCT application PCT/US2010/050615 dated Oct. 21, 2011, 12 pages.

* cited by examiner

*Primary Examiner* — Mark Kaucher
*Assistant Examiner* — Kregg Brooks
(74) *Attorney, Agent, or Firm* — Brooks, Cameron & Huebsch, PLLC

(57) ABSTRACT

A low color epoxy resin composition comprising (a) an epoxy resin and (b) at least one an inorganic phosphorous-containing compound stabilizing agent, for example an additive such as sodium pyrophosphate dibasic (SPD) compound; wherein the resulting epoxy resin composition is storage stable and the epoxy resin composition exhibits a low color. The low color epoxy resin composition is used to prepare an epoxy encapsulant which is useful in light emitting diodes (LEDs).

9 Claims, 4 Drawing Sheets

EPOXY RESIN COMPOSITIONS

This application is a National Stage application under 35 U.S.C. 371 of PCT/US2010/050615, filed on Sep. 29, 2010 and published as WO2011/041340 A1 on Apr. 7, 2011, which claims the benefit of U.S. Provisional Application Ser. No. 61/247,006 filed Sep. 30, 2009, the entire contents of which are incorporated herein by reference in its entirety.

BACKGROUND OF THE INVENTION

1. Field of the Invention

The present invention relates to low color epoxy resin compositions and the use of such compositions in light emitting diodes (LEDs).

2. Description of Background and Related Art

The field of optoelectronics is poised for explosive growth as optoelectronic devices such as light emitting diodes (LEDs) have expanded their applications into various display and lighting applications including signal lamps, full-color displays, and other lighting apparatus.

Certain epoxy resin materials have excellent optically transmissive, mechanical, and adhesion properties. For example, cycloaliphatic epoxies find special utility as encapsulants or coatings to house and protect the LEDs. However, conventional epoxy resin materials usually suffer from drawbacks such as color formations caused by heat and light generated from light emitters in the LEDs, resulting in a color degradation of the LED light outputs and shortening the service life of the LEDs.

Glycidyl-ether-containing epoxies, particularly those containing an aromatic moiety, can also suffer from increased color formation upon storage at elevated temperatures. In addition, these epoxies may also experience in increase in viscosity upon storage at elevated temperatures. A diglycidyl ether derived from an aromatic bisphenol compound (e.g., bisphenol A) is commonly referred to as a "liquid epoxy resin" or LER.

There is a need in the industry to develop a low color cyclic- or alicyclic-containing epoxy resin composition for use as an encapsulant or as a coating in LEDs in order to provide improved thermal stability, to reduce the rate of heat aged color formation, and to prolong the service life of LEDs. There is also a need to improve the storage stability of glycidyl-ether-containing epoxy resins.

SUMMARY OF THE INVENTION

One embodiment of the present invention is directed to an epoxy resin composition comprising (a) at least one epoxy resin and (b) at least one inorganic phosphorous-containing compound stabilizing agent.

Another embodiment of the present invention is directed to a process of making the low color epoxy resin composition of the present invention.

Still another embodiment of the present invention is directed to an epoxy resin encapsulant comprising the above low color epoxy resin composition of the present invention.

Yet a further embodiment of the present invention is directed to a light emitting diode comprising the above epoxy resin encapsulant.

Yet another embodiment of the present invention is directed toward a more storage stable glycidyl-ether-containing epoxy resin.

BRIEF DESCRIPTION OF THE DRAWINGS

FIG. 2 shows the data for Comparative Example C (an epoxy resin without sodium pyrophosphate dibasic (SPD)) and Example 2 (an epoxy resin with SPD).

FIG. 3 shows the data for Comparative Example C (an epoxy resin without SPD) and Example 2 (an epoxy resin with SPD).

FIG. 4 shows the data for Comparative Example C (an epoxy resin without SPD) and Example 2 (an epoxy resin with SPD).

DETAILED DESCRIPTION OF THE INVENTION

Figure 1:
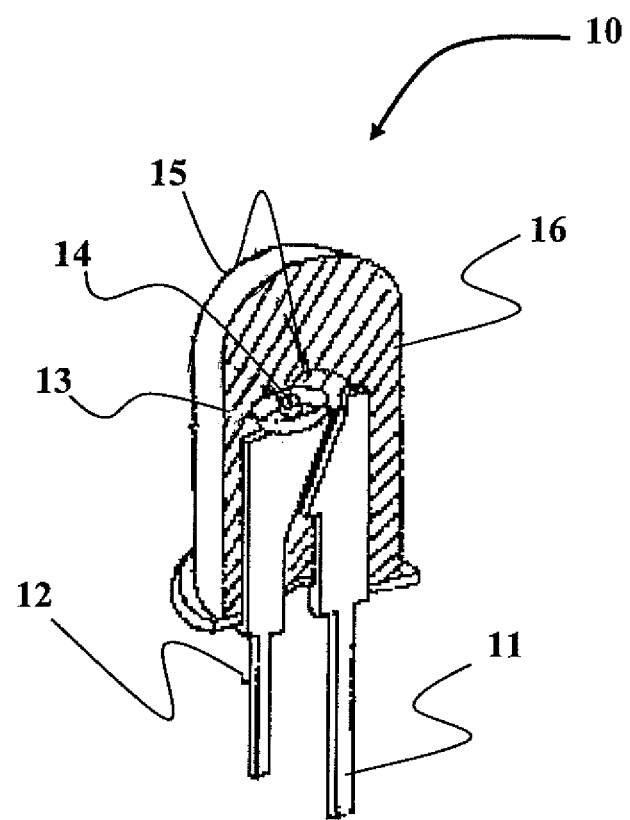
FIG. 1 is a perspective, partially cross-sectional view of a simple light emitting diode (LED) structure of the present invention.

The term "stability" herein means reduced rate of color and viscosity upon storage for example at least greater 30 days at a predetermined temperature of at least greater than 40 C. Preferably from 2 months to 2 years at a temperature of from 20° C. to about 40° C.

The term "color" herein means an absorption of electromagnetic energy of approximate wavelengths in the 300 to 760 nanometer range.

The term "low color" herein means less energy absorbing in the above color range.

As used herein, the term "low color additive" refers to an additive adapted for adding to a resin material and which is useful for reducing (or lowering) color formation of such resin material. The resin material may include any resin matrix such as for example an epoxy resin.

As used herein, the term "low color epoxy resin composition" refers to an epoxy resin composition containing a low color additive; wherein the resultant epoxy resin composition has a reduced or lower color formation than the same epoxy resin composition without such low color additive.

By "color stability" herein it is meant less change in color over a predetermined time versus a control.

"Thermal aging", with reference to a sample, means that the sample is heated to a temperature higher than a nominal 25° C. storage temperature; and then a certain predetermined property or properties, such as color and/or viscosity, of a sample with a stabilizer is compared to the same property of a 'control' sample without a stabilizer. To be effective, the stabilized sample material should show less of a color change than the non-stabilized control sample.

By "rate of color formation" herein it is meant rate of change of color per unit of time.

The phrase "entire visible light spectrum" herein means the visible light spectrum is electromagnetic energy of approximately 400 to 760 nanometer wavelengths.

According to the present invention, a low color epoxy resin composition comprises (a) at least one epoxy resin compound, and (b) at least one an inorganic phosphorous-containing compound stabilizing agent which is used for example as a low color additive. The low color additive may include for example an inorganic phosphate compound. In one illustration of the present invention, the phosphate compound may include for example a sodium polyphosphate or a sodium pyrophosphate. An example of a sodium pyrophosphate is, preferably, a sodium pyrophosphate dibasic (SPD) compound or a sodium pyrophosphate tetrabasic (SPT) compound.

The epoxy resin, component (a), used in the low color epoxy resin composition of the present invention may comprise one or more epoxide resin compounds which comprise one or more epoxy group per molecule. Epoxy resins are those compounds containing at least one vicinal epoxy group. The epoxy resin may be saturated or unsaturated, aliphatic, cycloaliphatic, aromatic or heterocyclic and may be substituted. The epoxy resin may also be monomeric or polymeric. An extensive enumeration of epoxy resins useful in the present invention is found in Lee, H. and Neville, K., "Handbook of Epoxy Resins," McGraw-Hill Book Company, New York, 1967, Chapter 2, pages 257-307; incorporated herein by reference.

The epoxy resins, used in embodiments disclosed herein for component (a) of the present invention, may vary and include conventional and commercially available epoxy resins, which may be used alone or in combinations of two or more. In choosing epoxy resins for compositions disclosed herein, consideration should not only be given to properties of the final product, but also to viscosity and other properties that may influence the processing of the resin composition.

Particularly suitable epoxy resins known to the skilled worker are based on reaction products of polyfunctional alcohols, phenols, cycloaliphatic carboxylic acids, aromatic amines, or aminophenols with epichlorohydrin. A few non-limiting embodiments include, for example, bisphenol A diglycidyl ether, bisphenol F diglycidyl ether, resorcinol diglycidyl ether, and triglycidyl ethers of para-aminophenols. Other suitable epoxy resins known to the skilled worker include reaction products of epichlorohydrin with o-cresol and, respectively, phenol novolacs. It is also possible to use a mixture of two or more epoxy resins.

The epoxy resins, component (a), useful in the present invention for the preparation of the curable compositions, may be selected from commercially available products. For example, ERL-4221 D cycloaliphatic epoxide, D.E.R.™ 331 epoxy resin, D.E.R.™ 332 epoxy resin, D.E.R.™ 334 epoxy resin, D.E.R.™ 580 epoxy resin, D.E.N.™ 431 epoxy novolac, D.E.N.™ 438 epoxy novolac, D.E.R.™ 736 epoxy resin, or D.E.R.™ 732 epoxy resin available from The Dow Chemical Company may be used. Other commercial epoxy resins that can be used for the epoxy resin component are D.E.R.™ 330 epoxy resins or D.E.R.™ 354 epoxy resins. As an illustration of the present invention, the epoxy resin component (a) may be a diglycidyl ether of bisphenol A, liquid epoxy resin, D.E.R.™ 383 epoxy resin having an epoxide equivalent weight of 175-185, a viscosity of 9.5 Pa–s and a density of 1.16 g/cc. D.E.R.™ is a trademark of The Dow Chemical Company.

Other suitable epoxy resins useful as component (a) are disclosed in, for example, U.S. Pat. Nos. 3,018,262, 7,163, 973, 6,887,574, 6,632,893, 6,242,083, 7,037,958, 6,572,971, 6,153,719, and 5,405,688, PCT Publication WO 2006/052727; U.S. Patent Application Publication Nos. 20060293172 and 20050171237, each of which is hereby incorporated herein by reference.

Generally, the epoxy resins useful in the present invention have an average molecular weight of from about 90 to about 2000, preferably from about 140 to about 1670, and more preferably from about 250 to about 1000.

The epoxide equivalent weight of the epoxy resins useful in the present invention is generally from about 70 to about 1000 and more preferably from about 98 to about 500. As used herein the terms "epoxide equivalent weight" refers to the average molecular weight of the polyepoxide molecule divided by the average number of oxirane groups present in the molecule.

In general, the epoxy resin component used in the low color epoxy resin composition is used in an amount of from about 50 weight percent (wt %) to about 99 wt %, more preferably, from about 63 wt % to about 99 wt % and, most preferably, from about 63 wt % to about 99 wt %, based on the total weight of the low color epoxy resin composition.

The phosphorous-containing compound (P-compounds), component (b), used in the epoxy resin composition of the present invention may comprise one or more phosphate compounds for example such as compounds selected from any inorganic pyrophosphate including for example alkali metal pyrophosphates such as sodium pyrophosphate, potassium pyrophosphate, triphenylphosphine, and mixtures thereof. Preferably, the phosphate compound used in the present invention selected from the group comprising alkali metal ions, alkaline earth ions, transition metal ions and the like. Other examples of the phosphate compounds useful in the present invention are described for example in Introduction to Phosphorous Chemistry, H. Goldwhite, Cambridge Press 128 pages et al., Pub. April 1981 (from Google); and Advanced Inorganic Chemistry, FA Cotton and G Wilkinson, Interscience Publishers, 1966, Chapter 20; each which is incorporated herein by reference.

Still other P-compounds useful for imparting a low color and low viscosity build to the epoxy resin formulations of the present invention include for example sodium pyrophosphate dibasic (SPD) also referred to in the art as disodium pyrophosphate and disodium dihydrogen pyrophosphate; and sodium pyrophosphate tetrabasic (SPT), and mixtures thereof. P-compounds along similar lines as the sodium pyrophosphate dibasic are described in EP 403,542 B1, incorporated herein by reference. EP 403,542 B1 describes for example the following P-compounds useful in the present invention, including tetrasodium pyrophosphate; methyl trisodium pyrophosphate; diisoamyl dipotassium pyrophosphate; t-butyl tetrapotassium tripolyphosphate; tetrapolyphosphates such as triethyl tripotassium tetrapolyphosphate; calcium hydroxy phosphate commonly referred to as tricalcium phosphate; and mixtures thereof.

Other examples of the P-compound useful in the present invention may include tetrasodium pyrophosphate, tetrabenzyl diphosphate, tetrabutylammonium pyrophosphate (3:1), and mixtures thereof.

Advantageously, the P-compound, component (b), provides the epoxy resin composition of the present invention with low color. Accordingly, the P-compound of the present invention may be considered "a low color additive." It has been discovered in the present invention that the presence of a small amount (for example less than about 175 ppm) of a low color additive in an epoxy resin (component (a) reduces the rate of color formation of an aged epoxy resin containing the low color additive compared to an aged epoxy resin without containing the low color additive.

An example of a preferred low color additive useful in the present invention may be an inorganic pyrophosphate compound including polypyrophosphates (polyphosphates), more preferably, a sodium pyrophosphate tetrabasic (SPT) compound or a sodium pyrophosphate dibasic (SPD) compound.

The chemical structure of SPT is as follows:

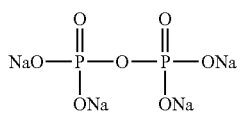

The chemical structure of SPD is as follows:

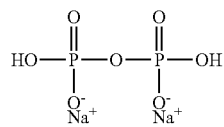

In general, it is desired to add as much pyrophosphate additive (i.e., the SPT or SPD) as possible to an epoxy resin composition to obtain the benefits desired, however, not so much that the pyrophosphate present in the epoxy resin composition becomes insoluble and causes haze. Accordingly, it is preferred that the amount of the pyrophosphate (i.e., the SPT or SPD) added to an epoxy resin composition to form a low color epoxy resin composition is generally in the range of from about 25 ppm up to about 175 ppm, preferably from about 100 ppm to about 175 ppm, and more preferably from about 125 ppm to about 175 ppm.

The low color additive useful in the present invention can be used to reduce the rate of color formation of the epoxy resins. For example, it has been shown that adding a low color additive, such as SPD, to an epoxy resin including for example a cycloaliphatic epoxy resin (CER) and a liquid epoxy resin (LER), has a beneficial effect on the color stability in accelerated aging experiments (see Examples herein below). Other properties of the epoxy resin, such as viscosity and epoxide equivalent weight (EEW), may also be improved as well by the presence a low color additive, such as SPD, in the epoxy resin (see Examples herein below).

Accelerated aging experiments are generally used to predict the effect of time and temperature on the color formation of epoxy resins. The accelerated aging experiments may be performed, for example, by (1) heating the epoxy resin to an elevated temperature for an extended time, generally from about 100° C. to about 200° C. and from about 1 hour to about 600 hours; (2) measuring the properties, such as color, EEW, and viscosity of the aged epoxy resin at specific time intervals, for example at about 1 to about 10 hour intervals; and (3) comparing the results of the properties measured after heating to the properties value that was measured at the beginning of the experiment. The accelerated aging experiment is useful for epoxy manufacturers to understand the response of the color and other properties of an epoxy resin when aging. The accelerated aging experiment is usually performed under an air atmosphere; the conditions which epoxy resins are usually stored and used for most of their applications.

Various accelerated aging experiments are well known in the art. One example of an accelerated aging experiment used in the present invention is to heat an epoxy resin sample for about 1 to 150 hours at 150° C. and measure the color.

In the present invention, the accelerated aging experiments are also used to measure the effects of using the low color additives such as SPD on the properties of aged epoxy resins with SPD compared to the properties of aged epoxy resins without using the low color additives (see Examples herein below and FIGS. 2-4).

An optional curing agent may be used in the epoxy resin composition of the present invention; and can include for example anhydrides, multifunctional carboxylic acids, amines, multifunctional amines, super acids (such as $HPF_6$, $HSbF_6$, $CF_3SO_3H$ and the like), and mixtures thereof.

An optional catalyst may be used in the epoxy resin composition of the present invention; and can include for example one or more Lewis acids and bases.

Other optional components, that may be useful in the present invention, are components normally used in resin formulations known to those skilled in the art. An assortment of additives may be added to the compositions of the present invention including for example, anhydrides, fillers, pigments, other epoxy resins that are different from component (a), stabilizers, plasticizers, catalyst de-activators, and mixtures thereof.

The concentration of the optional additives used in the present invention may range generally from 0 wt % to about 99 wt %, preferably from about 0.1 wt % to about 95 wt %, more preferably from about 0.25 wt % to about 75 wt %, and most preferably from about 0.5 wt % to about 33 wt % based on the total weight of the composition.

A curable or thermosettable low color epoxy resin composition may be prepared in the present invention comprising the low color epoxy resin composition described above mixed with a curing agent (crosslinking agent or hardener) in amounts which will effectively cure the curable epoxy resin composition. Examples of curing agents may include but are not limited to anhydrides, amines, phenolic compounds, and acids. The curable low color epoxy resin composition may also optionally include a curing catalyst. The curable low color epoxy resin composition, when cured under curing conditions, provides a cured or thermoset epoxy resin.

The process of curing the low color curable alicyclic- or cycloaliphatic-containing epoxy resin composition of the present invention may be conducted at atmospheric (e.g. 760 mm Hg), superatmospheric or subatmospheric pressures and at a temperature from about 0° C. to about 300° C., preferably from about 25° C. to about 250° C., and more preferably from about 50° C. to about 200° C.

The process of curing the low color curable glycidyl-ether-containing epoxy resin composition of the present invention may be conducted at atmospheric (e.g. 760 mm Hg), superatmospheric or subatmospheric pressures and at a temperature from about −10° C. to about 250° C., more preferably from about 10° C. to about 220° C., and more preferably from about 25° C. to about 200° C.

The time required to complete the curing may depend upon the temperature employed. Higher temperatures generally require a shorter period of time whereas lower temperatures generally require longer periods of time. In general, the required time for completion of the curing is from about 1 minute to about 48 hours, preferably from about 15 minutes to about 24 hours, and more preferably from about 30 minutes to about 12 hours.

It is also operable to partially cure the low color curable epoxy resin composition of the present invention to form a partially cured intermediate product and then subsequently fully cure the intermediate product completely at a later time.

The low color epoxy resin composition of the present invention may be useful in many applications, such as encapsulants for LEDs (there are many LED end uses including lighting, optical fiber emitters, auto lighting, turn signals and the like); optical sensors, lenses for readings and the like, telescope optics, film adhesives for OLEDs (organic light emitting diodes), photovotalics cell encapsulants and coatings, weatherable epoxy coatings, outdoor electrical insulators, and any epoxy coating formulation.

In the case of glycidyl-ether-containing epoxies, the low color epoxy resin composition of the present invention may be particularly useful in decorative and protective coatings. Examples of these coatings may include, but are not limited to, general metal coatings such as food can linings, or powder coatings for appliances or pipelines. Other end use for these glycidyl-ether-based resins are as binders in applications such composites and electrical circuit boards. Furthermore, the glycidyl-ether-containing epoxy resins may find utility as components in potting and casting applications.

Preferably, the low color alicyclic or cycloaliphatic epoxy resin compositions of the present invention may be useful for example, in applications which require high glass transition temperature (Tg) such as a Tg of greater than about 100° C., good resistance to electrical arc track resistance (as measured by method ASTM D2303) such as a resistance of greater than about 1000 minutes to track, low color such as a color of less than about 50 APHA, and a low hydrolyzable chloride content of less than about 250 ppm.

In one embodiment of the present invention, the low color epoxy resin compositions may be used in electrical castings (e.g. potting and encapsulating coatings) for a light emitting diode (LED). In many optoelectronic applications of epoxy resins, like LED encapsulating, epoxy compositions that have low color after cure or after accelerated aging testing are desired. The low color epoxy resin composition of the present invention may particularly be useful for special LED applications requiring very low color like white and blue high intensity (for example greater than about 18 lumens per watt) LEDs.

In one embodiment of the present invention, the low color alicyclic or cycloaliphatic epoxy resin composition of the present invention may be used in a light emitting diode (LED) as an epoxy encapsulant.

An LED is a solid state device comprising a doped semiconductor (PN) junction semiconductor diode that emits light when current is applied. FIG. 1 shows an example of a LED structure of the present invention generally indicated by numeral 10. In general, a basic structure of a LED, as shown in FIG. 1, may comprise an anode 11, a cathode 12, a reflector 13, a LED-chip (LED semiconductor) 14, a wire bond (whisker) 15, and an encapsulant 16 to cover or house the LED 10. The low color epoxy resin composition of the present invention may be used for the encapsulant 16.

The type of LED semiconductor 14 used in the LED 10 determines the color of the LED output light. The LED semiconductor may be formed from a combination of (i) one or more Group III elements and (ii) one or more Group V elements resulting in a III-V semiconductor. Examples of suitable III-V semiconductor materials include nitrides, such as gallium nitride; and phosphides, such as indium gallium phosphide. LED emission from GaN-based III-V compound semiconductors, such as InGaN, AlGaN, AlInGaN, and GaN, can cover the entire visible light spectrum from short wavelengths (i.e., UV) to longer wavelengths (i.e., red light).

In a LED, electrical power is converted to both light and heat. Any encapsulant material useful in the present invention requires withstanding heat dissipated from both electrical and luminous inefficiency; and the encapsulant must remain transparent as desired by the applications of the LEDs in order to extend the service life of the LEDs. Service life or operating life of a LED is characterized by the degradation of the LED light output intensity over time. When the LED degrades to half of its original intensity after a period of time, it is considered at the end of its useful service life. Service life of a typical LED may be for 10,000 hours to 100,000 hours of "power on time". Power on time means the actual time voltage is applied to an LED and light is emitted. It is contemplated that using the epoxy encapsulant composition of the present invention, the service life of an LED may be extended beyond the service life of a typical LED.

According to another embodiment of the present invention, the epoxy encapsulant comprises a low color epoxy resin composition, which comprises (a) an epoxy resin and (b) a low color additive; wherein the low color additive comprises a pyrophosphate compound such as sodium pyrophosphate tetrabasic compound (SPT), a sodium pyrophosphate dibasic compound (SPD), or mixtures thereof.

It has been discovered in the present invention that the low color epoxy resin encapsulants of the present invention are useful for reducing the rate of the heat aged color formation, for example to less than 30% of that of a non-stabilized epoxy resin.

The epoxy encapsulant of the present invention can be used in various types of the LEDs. For example, in one embodiment, the encapsulant is particularly useful in LEDs with high luminous efficiency (e.g. greater than about 5 lumens per watt (lm/W)). An example of these types of LED is high brightness (e.g. greater than about 28 lm/W (high output LEDs)) LEDs (HB LEDs). An HB LED, generally, is referred to as a type of LED that is fabricated from AlGaAs (red), InGaAlP (yellow-green through red), or InGaN (blue, blue-green, green, and white) materials. The HB LEDs generally have a luminous efficiency of greater than about 5 lm/W, preferably greater than about 22 lm/W, and more preferably greater than about 65 lm/W. The HB LEDs can be used in applications such as automotive signs, backlight signals, and electronic equipment.

The following Examples further illustrate the present invention in detail but are not to be construed as limiting the scope thereof.

Various terms and designations used in the following Examples include for example as follows: ERL-4221 D cycloaliphatic epoxide is a distilled cycloaliphatic epoxy, commercially available from The Dow Chemical Company; D.E.R.™ 331 epoxy resin is a diglycidyl ether of bisphenol A, commercially available from The Dow Chemical Company; "SPD" stands for sodium pyrophosphate dibasic; "SPT" stands for sodium pyrophosphate tetrabasic; "EEW" stands for epoxide equivalent weight; and "ppm" stands for part per million.

EXAMPLE 1 AND COMPARATIVE EXAMPLES A AND B

Sample A comprises an epoxy resin (ERL-4221 D) only and was used as a control sample ("Comparative Example A"). Sample B comprises an epoxy resin (ERL-4221D) and VICTAWET® 35B ("Comparative Example B"). Sample C comprises an epoxy resin (ERL-4221D) and SPT supplied from Akzo ("Example 1" of the present invention).

The color of the above samples was measured by a Platinum-Cobalt/Hazen/APHA color scale ranging from 0 to 500, with 0 being the lightest and 500 being the darkest. The Platinum-Cobalt/Hazen/APHA color scale contains a series of clear light yellow liquids (PtCo standards) from light color to dark color, with the lightest color labeled as 0 and the darkest color labeled as 500. The PtCo standards are prepared by specified dilutions of a platinum-cobalt stock solution to the series of clear light yellow liquids. The PtCo color of the samples is measured by first placing the PtCo standards in glass cylinders. The above samples are placed in the same type of glass cylinders with the same liquid depth to provide the same path length for color comparison again the PtCo standards.

The accelerated aging of the samples were measured as follows: The samples of Comparative Examples A and B, and Example 1 were placed in a 150° C. oven. After about 120 hours, the samples were removed from the oven and cooled to ambient temperature (e.g. about 25° C.). The color of the samples was checked against the PtCo standards. The results are described in the following Table I.

TABLE I

Color Results

| Sample | ERL-4221 D Epoxy Resin (grams) | SPT Additive (ppm) | VICTAWET® 35B (ppm) | Color @ 120 hours and 150° C. (PtCo) |
|---|---|---|---|---|
| Comparative Example A | 600 | 0 | 0 | 125 |
| Comparative Example B | 600 | 0 | 350 | >500 |
| Example 1 | 600 | 175 | 0 | 37 |

Comparative Example B, which comprises VICTAWET® 35B (a sodium salt of 2-ethylhexyl phosphate; an anionic phosphate ester commercially available from SPI Supplies) without the SPT additive, has a higher rate of color formation over the 120 hours aging experiment. The color of the resulting aged Comparative Example B after 120 hours is greater than about 500. However, for Example 1, which comprises the SPT additive without the presence of the VICTAWET®35B, the color of the resulting aged Example 1 is reduced to 37. Accordingly, the presence of the SPT significantly reduces the color formation of the aged epoxy resin.

EXAMPLE 2 AND COMPARATIVE EXAMPLE C

A sample comprising epoxy resin (D.E.R.™ 331) only was used as a control sample ("Comparative Example C"). Comparative Example C was prepared by adding 600 grams (g) of epoxy resin, D.E.R.™ 331, into a 32-ounce wide mouth glass jar. A sample comprising an epoxy resin, D.E.R.™ 331, and SPD (practical grade commercially available from Sigma) ("Example 2"), was prepared by adding 600 grams of D.E.R.™ 331 epoxy resin into a 1000-mL plastic tripour. The tripour containing the D.E.R.™ 331 epoxy resin was secured on a high speed disperser. The bottom of a mixing blade was positioned about ¾-inch from the bottom of the tripour and a shaft was centered approximately within the tripour. The D.E.R.™ 331 epoxy resin was mixed at a moderate speed (i.e. at a speed of about 200 to about 1000 rpm) using a vortex. 0.105 g of SPD was added to the epoxy resin after the resin was mixed for about 1 minute. The D.E.R.™ 331 epoxy resin and SPD were mixed continuously for 15 minutes to form a mixture, referred to herein as "Example 2."

Example 2 was then transferred into a 32-ounce wide mouth clear glass jar.

There were no visible particles of SPD present in Example 2 after mixing the epoxy resin, D.E.R.™ 331 epoxy resin, together with SPD.

A piece of aluminum foil was placed and fitted by hand over each glass jar containing Comparative Example C and Example 2. The aluminum foil lids were used to protect the samples from air borne contamination; the intent was not to try to control the atmospheric composition of the head space in the jars in any way.

The properties of color, viscosity, and EEW of Comparative Example C (without the SPD) and Example 2 (with the SPD) as a function of time after storing the samples at a constant elevated temperature (150° C.) were measured according to the following methods:

The color of Comparative Example C and Example 2 was measured according to ASTM D1209 using a Hunter colorimeter and a 20-mm path length.

The viscosity (Brookfield Viscosity) of Comparative Example C and Example 2 was measured according to ASTM D4878 except that a cone (CPE #52) and plate were used in place of a spindle.

The EEW of Comparative Example C and Example 2 were measured according to ASTM D1652.

Each of the 32-ounce wide mouth clear glass jars containing Comparative Example C and Example 2 were placed and stored in an oven operated at 150° C. Aliquots of Comparative Example C and Example 2 were collected by removing the samples from the oven and collecting the aliquots at time intervals of 3, 7, 14, 21, and 29 days.

Both Comparative Example C and Example 2 were removed from the oven at the same time at intervals. At each interval, 60 grams of aliquot from each of Comparative Example C and Example 2 was transferred from the 32-ounce glass jar to 2 ounce jars. The 2-ounces glass jars were then sealed using plastic lids that were supplied with the jars. The aluminum foil lids were placed on the 32-ounce jars and the jars were returned to the 150° C. oven. The aliquots collected were stored at ambient conditions (e.g. 760 mmHg and 25° C.).

The Comparative Example C and Example 2 in the 32-ounce jars were stored in the 150° C. oven for a total of 29 days. The process of collecting aliquots at time intervals was repeated at time intervals of 3, 7, 14, 21, and 29 days. All the aliquots collected in the 2-ounce glass jars were submitted as a sample set for analysis at the same time.

The color, viscosity, and EEW of the aliquots collected from Comparative Example C (without the SPD) and Example 2 (with the SPD) at time intervals were measured. The results for color and viscosity are shown in the following Tables II and III.

Figure 2:
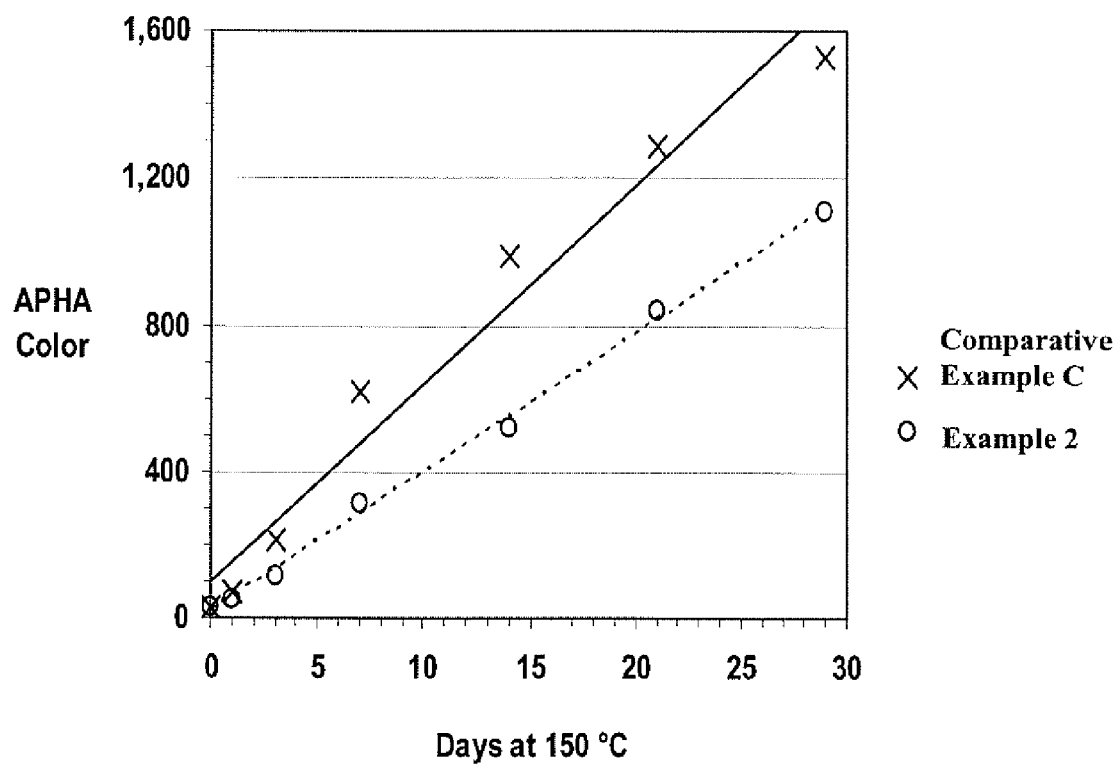
FIG. 2 is a graphical illustration showing color formation (APHA Color) of a sample as a function of time after storing the sample at a constant elevated temperature (Days at 150° C.).
Figure 3:
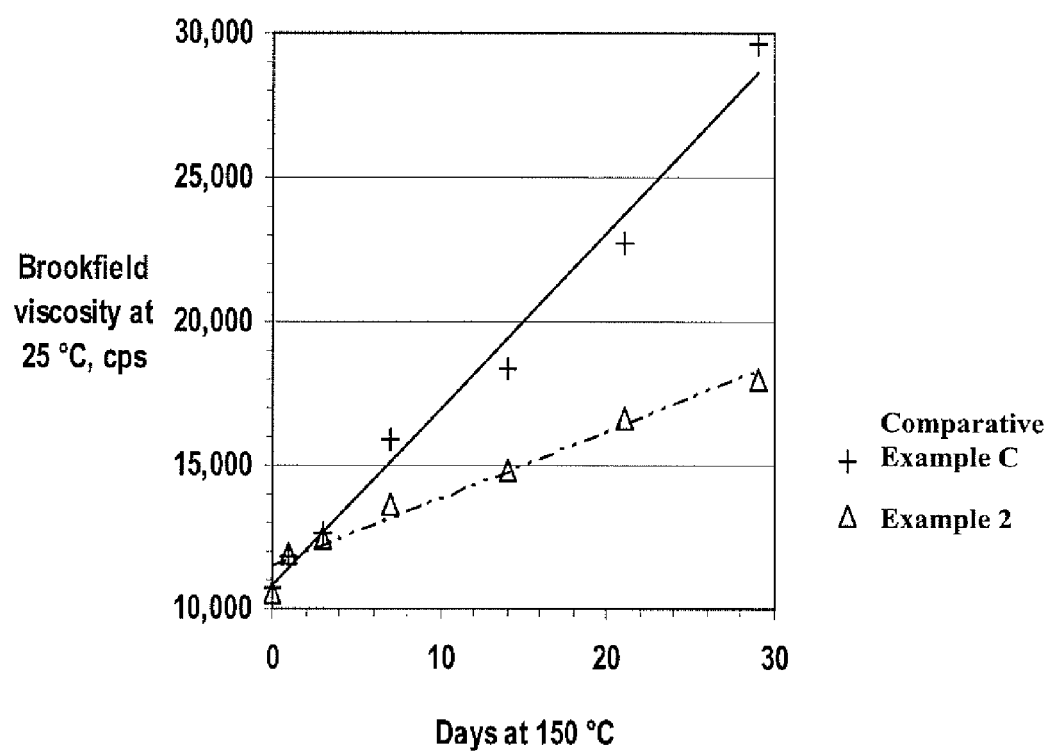
FIG. 3 is a graphical illustration showing viscosity (Brookfield viscosity at 25° C., cps) of a sample as a function of time after storing the sample at a constant elevated temperature (Days at 150° C.).
Figure 4:
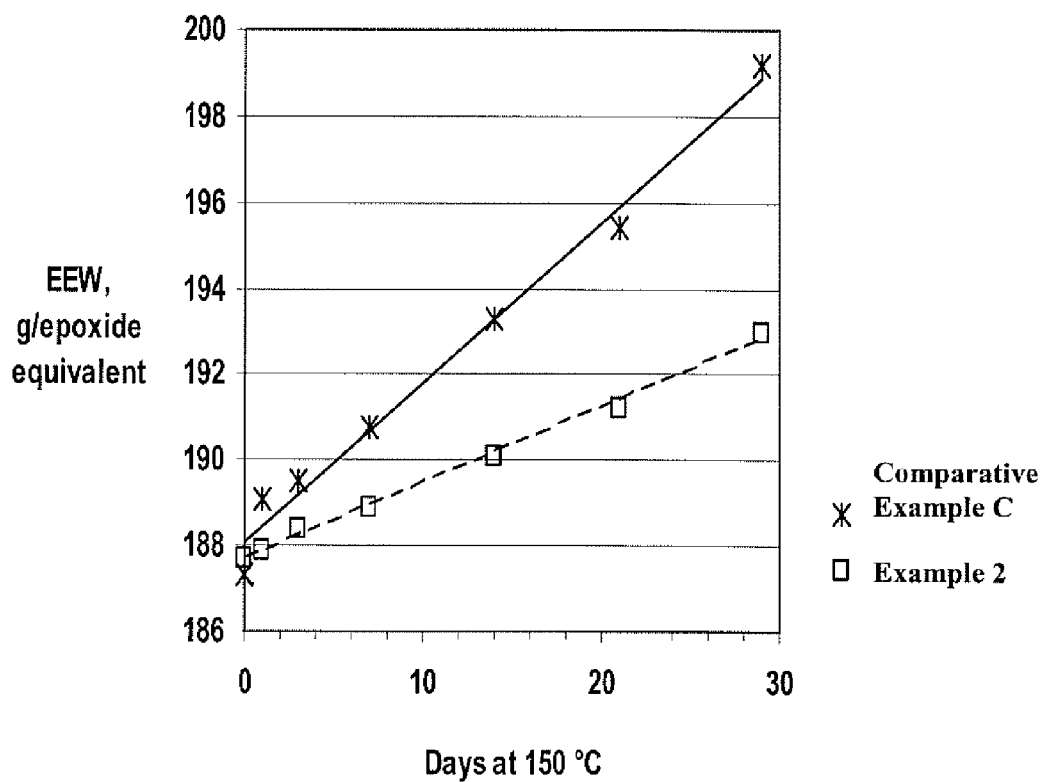
FIG. 4 is a graphical illustration showing epoxide equivalent weight (EEW) measurements for a sample as a function of time after storing the sample at a constant elevated temperature (Days at 150° C.).

The results of the color, viscosity, and EEW of the Comparative Example C and Example 2 are also depicted as a function of time (days) in FIGS. 2-4.

TABLE II

Color Results

| Number of Days Samples Stored at 150° C. | Comparative Example C (without SPD) (Pt—Co) | Example 2 (with SPD) (Pt—Co) |
|---|---|---|
| 0 | 31 | 29 |
| 1 | 72 | 53 |
| 3 | 215 | 115 |
| 7 | 619 | 310 |
| 14 | 988 | 522 |
| 21 | 1,286 | 839 |
| 29 | 1,531 | 1,109 |

The increase in the color of Comparative Example C and Example 2 indicates that color formation occurred in both samples during the 29-day aging experiment at 150° C. However, Example 2 with the SPD has less color increase compared to Comparative Example C without SPD over the course of the 29-day aging experiment. Accordingly, the presence of the SPD significantly reduced the color formation of the aged epoxy resin.

TABLE III

Viscosity Results

| Number of Days Samples Stored at 150° C. | Comparative Example C (without SPD) (centipoises at 25° C.) | Example 2 (with SPD) (centipoises at 25° C.) |
|---|---|---|
| 0 | 10,716 | 10,567 |
| 1 | 11,827 | 11,926 |
| 3 | 12,660 | 12,462 |
| 7 | 15,895 | 13,633 |
| 14 | 18,405 | 14,809 |
| 21 | 22,746 | 16,619 |
| 29 | 29,617 | 17,959 |

The increase in the viscosity of Comparative Example C and Example 2 suggests that oligomers may be formed in both samples during the 29-day aging experiment because higher molecular weight oligomers increase the viscosity of Comparative Example C and Example 2. The results indicate that the SPD may retard the reaction which causes the increase of the viscosity. The reaction that caused the viscosity to increase may also increase the molecular weight of the oligomers, the concentration of the oligomers, or both the molecular weight and concentration of the oligomers present in Comparative Example C and Example 2.

Based on FIGS. 2 and 3, the properties (color, and viscosity,) of epoxy resins (Comparative Example C and Example 2) increased as a function of time at an elevated temperature (e.g. 150° C.). However, the increase in color, and viscosity, of the Example 2 (with the SPD) was lower than the corresponding increase in Comparative Example C (without the SPD). The results indicate that the presence of the SPD in Example 2 retarded the changes of the properties of the epoxy resins as a function of time at an elevated temperature compared to the Comparative Example C containing no SPD.

The solubility of SPD in LER may be measured. SPD concentrations in LER higher than the test concentration (0.0175% w/w), if SPD is soluble, could potentially have stronger retarding effects than the results reported here and previously. If SPD is soluble at higher concentrations in LER then the effects of higher SPD concentrations on LER color may be measurable using accelerated aging experiments. The effect of SPD on the color of fully formulated and cured epoxy compositions may be tested using accelerated aging.

EXAMPLES 3-5 AND COMPARATIVE EXAMPLE D AND E

A heat aging study was conducted on a cycloaliphatic resin, ERL-4221 D, and an epoxy resin, D.E.R.™ 332. The P-compounds were mixed directly into the epoxy resin. Resin samples were made up in approximately 300-350 milliliters (ml) quantities and placed into a temperature controlled oven at 150° C. The samples were taken out at noted intervals and the color was measured. Samples were placed into a 20 ml cell and readings were made against a Platinum-Cobalt color scale using a Hunter calorimeter. Three readings were averaged to give the reported APHA numbers shown in Table IV for the cycloaliphatic resin and in Table V for the aromatic epoxy resin.

TABLE IV

Color Results

| Number of Hours Samples Stored at 150° C. | Comparative Example D (ERL-4221 D) Control | Example 3 (ERL-4221 D + 100 ppm tetrasodium pyrophosphate) | Example 4 (ERL-4221 D + 350 ppm triphenylphosphine) |
|---|---|---|---|
| 0 | 18.5 | 20.2 | 21.9 |
| 4 | 22.5 | 15.5 | 53.2 |
| 33 | 127.2 | 58.9 | 98.9 |
| 85 | 409.2 | 165 | 297.9 |

As described in Table IV above, the presence of the tetrasodium pyrophosphate and triphenylphosphine significantly reduced the color formation of the aged epoxy resin.

TABLE V

Color Results

| Number of Hours Samples Stored at 150° C. | Comparative Example E (D.E.R. 332) Control | Example 5 (D.E.R. 332 + 175 ppm tetrasodium pyrophosphate) |
|---|---|---|
| 0 | 16 | 20.6 |
| 4 | 40.3 | 37.7 |
| 12 | 68.3 | 61.2 |
| 16 | 94.9 | 85.7 |
| 42 | 275.2 | 265.2 |
| 66 | 448.6 | 356.2 |
| 91 | 584.1 | 440.9 |

As described in Table V above, the presence of the tetrasodium pyrophosphate significantly reduced the color formation of the aged epoxy resin.

EXAMPLE 6

A sample comprising 300 g of a cycloaliphatic epoxide, ERL4221D, and 0.0526 g of SPD was prepared and is referred to herein as "Example 6." Example 6 was prepared by mixing together the above materials at 1690 rpm following the procedure that was described for Example 2. The SPD concentration was 175 ppm in the sample of Example 6.

The appearance of the sample of Example 6 was a white and foamy liquid immediately after the preparing the sample. The appearance of the sample of Example 6 changed to a clear and transparent liquid over time as the bubbles in the liquid broke.

EXAMPLE 7 AND COMPARATIVE EXAMPLE F

Plaque Preparation

Plaques were prepared by manually mixing together the ingredients described for each sample in an 8-ounce glass jar. The samples were degassed for three minutes at 2500 rpm using centrifugation. Each sample was poured into a separate metal mold and next the molds were placed in a forced-air oven set at the temperature 90° C. The forced-air ovens used were Blue M brand (Thermal Process Solutions, New Columbia, Pa.). A two-step cure schedule was used to prepare the plaques. The mold containing the example composition and the mold containing the respective comparative example composition were both placed in an oven at the same time to prepare the plaques for use under the same experimental conditions.

The first step of the cure schedule consisted of heating at 90° C. for two hours in an oven molds containing samples. The first step of the cure schedule was applied to increase the polymer molecular weight without forcing relatively volatile ingredients like for example the anhydride to evaporate from the mold while simultaneously the polymer molecular weight was increasing which can cause bubbles to form that can appear in the thermoset samples.

Avoiding air bubbles in thermosets is important when epoxy formulations are used to protect electronic and electrical parts, circuits, and connections. The epoxy is frequently applied as a relatively thick mass and is thermally cured for these applications and these effects can combine to promote the appearance of air bubbles in the thermoset.

The evaporation of volatile reactive ingredients can change slightly and non-reproducibly the composition and the stoichiometry among the reactive chemical ingredients which can change slightly the final properties of the thermoset.

The second step of the cure schedule consisted of adjusting the oven temperature from 90° C. to a higher temperature which depended on the example. The second step of the cure schedule was used to further advance the polymer molecular weight and to crosslink fully the thermoset.

After completing the second step of the cure schedule the oven temperature was adjusted to 60° C. The molds were removed from the oven 16-hours after it was set to 60° C. The molds were dismantled and the resulting plaques (6 inches long×6 inches wide×⅛ inch thick) were removed from the molds.

A plaque sample comprising 42.57 g of sample Example 4, 49.56 g of methyl tetrahydrophthalic anhydride (MTHPA), 7.40 g of TONE™ 0301 caprolactone triol, and 0.49 g of 1,8-diazabicyclo[5.4.0]-undec-7-ene (DBU) catalyst was prepared and is referred to herein as "Example 7." TONE 0301 was obtained from The Dow Chemical Company. MTHPA was product ECA100 obtained from Dixie Chemical Company, Inc., Pasadena, Tex. DBU was obtained from Sigma-Aldrich Chemical Co., Milwaukee, Wis.

A plaque sample comprising 42.55 g of ERL4221D, 49.57 g of MTHPA, 7.38 g of TONE 0301, and 0.51 g of DBU was prepared and used as a control sample ("Comparative Example F").

The second step of the cure schedule was three hours at 160° C. for the sample of Example 7 and of Comparative Sample F.

A specimen of about 10 mg was removed from each plaque using a wire cutter. Each specimen was used to measure the glass transition temperature (Tg) of the thermoset using a differential scanning calorimeter (DSC) that was supplied by TA Instruments, New Castle, Del. Each specimen was contained in an open aluminum DSC pan.

The software used to operate the DSC was programmed to thermally process each specimen using two consecutive thermal ramps using the following method log:
1: Equilibrate at 30.00° C.
2: Ramp 10.00° C./min to 220.00° C.
3: Mark end of cycle 1
4: Equilibrate at 30.00° C.
5: Mark end of cycle 2
6: Ramp 10.00° C./min to 220.00° C.
7: End of method The first thermal ramp was used to remove from the specimen the thermal history and stresses associated with network formation. The second thermal ramp was used to measure the specimen Tg.

The Tg associated with the specimen was measured using software which calculated the mid-point of the deflection of the response of the sample to the thermal process applied using the DSC. Two specimens for each sample were analyzed for Tg using the DSC and the results were recorded and reported.

The appearance of the thermoset samples of Example 7 and of Comparative Example F was yellow and transparent in each case.

The mass of the specimens of the sample of Example 7 that were used to measure the Tg were 13.70 mg and 12.97 mg and the Tg results were 179.88° C. and 177.89° C., respectively. The average value of the Tg measurements was 178.89° C. and the standard deviation was 1.4071° C. for the sample of Example 7 that contained cycloaliphatic epoxide and SPD.

The mass of the specimens of the sample of Comparative Example F that were used to measure the Tg were 11.93 mg and 10.37 mg and the Tg results were 176.50° C. and 176.85° C., respectively. The average value of the Tg measurements was 176.68° C. and the standard deviation was 0.2475° C. for the sample of Comparative Example F that contained cycloaliphatic epoxide and did not contain SPD.

The Tg results indicated the presence of SPD in the sample of Example 7 did not have a negative effect on the thermoset Tg compared to the Tg of the sample of Comparative Example F that did not contain SPD.

The Tg was measured for the samples because Tg is often used to provide an indication of the degree of cure and of the thermal resistance properties of thermosets.

EXAMPLE 8 AND COMPARATIVE EXAMPLES G

Plaque Preparation

A plaque sample comprising 41.88 g of sample Example 2, 37.65 g of methyl hexahydrophthalic anhydride (MHHPA), and 0.80 g of benzyldimethylamine (BDMA) catalyst was prepared and is referred to herein as "Example 8." MHHPA was product Lindride 52D obtained from Lindau Chemicals, Inc., Columbia, N.C. BDMA was obtained from Sigma-Aldrich.

A plaque sample comprising 41.87 g of D.E.R.™ 331 epoxy resin, 37.65 g of MHHPA, and 0.80 g of BDMA was prepared and used as a control sample ("Comparative Example G").

The second step of the cure schedule was four hours at 150° C. for the samples of Example 8 and of Comparative Example G.

The appearance of the thermoset samples of Example 8 and of Comparative Example G was yellow and transparent in each case.

The DSC and method log that were used to measure the Tg of the sample of Example 7 were used to measure the Tg of the sample of Example 8 and of the Comparative Example G.

The mass of the specimens of the sample of Example 8 that were used to measure Tg were 11.96 and 12.58 mg and the Tg results were 147.58° C. and 146.42° C., respectively. The average value of the Tg measurements was 147.00° C. and the standard deviation was 0.8202° C. for the sample of Example 8 that contained D.E.R. 331 and SPD.

The mass of the specimens of the sample of Comparative Example G that were used to measure Tg were 14.15 mg and 14.41 mg and the Tg results were 148.70° C. and 148.26° C., respectively. The average value of the Tg measurements was 148.48° C. and the standard deviation was 0.3111° C. for the sample of Comparative Example G that contained D.E.R. 331 epoxy resin and did not contain SPD.

The Tg results indicated the presence of SPD in the sample of Example 8 had little negative effect on the thermoset Tg compared to the Tg of the sample of Comparative Example G that did not contain SPD.

EXAMPLE 9 AND COMPARATIVE EXAMPLE H

Thin Film Coating Preparation

Coatings were prepared by manually mixing together D.E.R.™ 331 epoxy resin and D.E.H.™ 52 epoxy curing agent in 8-ounce glass jars. The D.E.H. 52 epoxy curing agent, which contains amine functionality, was obtained from The Dow Chemical Company.

The substrates, to which the thin film coatings were applied, were the matte-finish iron-phosphate (Bonderite 1000) treated side of low-carbon cold-rolled steel test panels. The treated steel panels were purchased from Q-Lab Corporation, Cleveland, Ohio.

A #10 doctor coating application bar was used to apply one thin film of each sample to two steel panels.

One coating of each sample applied to a steel panel was forced-cured by heating the panel at 60° C. (140° F.) for 16 hours using a forced-air oven and such samples are referred to herein as "the 60° C. samples." One coating of each sample applied to a steel panel was cured at 21.7° C. (71° F.) by allowing the panels to sit on a lab bench for a minimum time of 16 hours and these samples are referred to herein as "the room temperature samples."

A sample comprising 24.38 g of an aliquot of Example 2 and 5.61 g of D.E.H. 52 epoxy curing agent was prepared and is referred to herein as "Example 9."

A sample comprising 24.33 g of D.E.R.™ 331 epoxy resin and 2 5.71 g of D.E.H. 52 epoxy curing agent was prepared and used as a control sample ("Comparative Example H").

The properties of the above coatings were determined after curing the coatings for 16 hours as described by the definition of the 60° C. and the room temperature samples.

The solvent resistance of the coating samples was measured using method ASTM D4752 which is a solvent rub method. The coating surface was manually rubbed using a paper towel saturated with acetone by applying pressure to the towel using a forefinger after donning butyl rubber gloves to avoid skin contact with the solvent. A back and forth rubbing motion was applied to an area of about two square inches of the coating surface. The number of rubs required to damage or soften the coating was observed and recorded.

Solvent swelling can be used to indicate the level of conversion of reactive chemical functionality of thermosets based on the theory of swelling of network structures as described the following textbook: Flory, P. J., "Principles of Polymer Chemistry", Cornell University Press, 1953. The higher the level of conversion or the higher the molecular weight of the network the greater the solvent resistance. The solvent rub method is a crude way to use a coating sample that has been applied to a substrate to approximate quickly and relatively the results that would be expected using an equilibrium swelling method. An equilibrium swelling method requires a free coating film sample and time for the sample to reach thermodynamic equilibrium in the presence of a solvent.

The appearance of the coatings was observed and recorded. The surface tackiness (stickiness) and the hardness of the bulk coating beneath the surface were determined by pressing the coating surface using a forefinger after first donning butyl rubber gloves to prevent skin contact with unreacted epoxy present on the coating surface.

The 60° C. sample of Example 7 and the sample of Comparative Example H were glossy, hard, and not tacky and the solvent resistance was more than 100 acetone rubs.

Sixteen and 48 hours after the coatings were applied to the steel panels, the surface of the room temperature sample of Example 9 and of the sample of Comparative Example H appeared hazy and low gloss and felt tacky but hard. Seven days after the coatings were applied to the steel panels, the coatings of Example 9 and of the Comparative Example H felt dry and not tacky and the other properties remained the same as the coatings were described after 16 and after 48 hours.

There was no difference observed in the appearance and the properties between the samples of Example 9 and of the Comparative Example FH after comparing the 60° C. and the room temperature samples which indicated the presence of SPD in the epoxy-amine coating did not affect the cure and the properties.

The hazy and low gloss appearance and tackiness of the room temperature samples was likely attributed to reactions that are known to occur between amines and carbon dioxide and moisture in the presence of humid air near the interface between the coating and the atmosphere. Carbon dioxide and moisture compete with epoxy for amine. The result of the competitive reactions are that unreacted epoxy remains and hydrated amine salts form near the coating surface which are responsible for the hazy and low gloss appearance and the tacky feel of the surface.

The competitive reactions have less affect on the bulk coating properties below the surface because diffusion of carbon dioxide and moisture from the surface into the bulk are inhibited by the polymer network that forms.

The 60° C. samples were observed to be essentially unaffected by reactions between amine and carbon dioxide and moisture in the air. The warm air sweeping the coating surface in the oven served to limit the reactions between amine and carbon dioxide and moisture and accelerated the reactions between amine and epoxy.

While the present disclosure includes a limited number of embodiments, the scope of the present invention should be limited only by the attached claims and not by the embodiments herein as other embodiments are possible to those skilled in the art having benefit of this disclosure.

What is claimed is:

1. An epoxy resin composition consisting of an admixture, wherein the admixture consists of (a) at least one epoxy resin and (b) from 25 ppm to 175 ppm of an inorganic pyrophosphate compound based on the total weight of the composition; wherein said inorganic pyrophosphate compound increases the storage stability of the final epoxy resin composition.

2. The composition of claim 1, wherein the inorganic pyrophosphate compound is sodium pyrophosphate dibasic or sodium pyrophosphate tetrabasic.

3. The composition of claim 1, wherein the amount of the inorganic pyrophosphate present in the composition is from 100 ppm to 175 ppm based on the total weight of the composition.

4. The composition of claim 1, wherein the epoxy resin comprises a cycloaliphatic epoxy resin, an alicyclic epoxy resin, an aromatic epoxy resin, a liquid epoxy resin, or mixtures thereof.

5. The composition of claim 1 having a reduced tendency toward homopolymerization as compared to compositions that do not include an inorganic pyrophosphate compound.

6. A process for producing a low color epoxy resin composition consisting of mixing an admixture, wherein the admixture consists of (a) at least one epoxy resin (b) from 25 ppm to 175 ppm of an inorganic pyrophosphate compound based on the total weight of the composition; and (c) a curing agent; wherein said inorganic pyrophosphate compound increases the storage stability of the final low color epoxy resin composition.

7. The process of claim 6, wherein the curing agent is selected from the group comprising an anhydride, a phenolic, an amine, a carboxylic acid, a cationic compound, super acids, or mixtures thereof.

8. The process of claim 6, wherein the inorganic pyrophosphate compound is sodium pyrophosphate dibasic or sodium pyrophosphate tetrabasic.

9. The process of claim 6, wherein the amount of the inorganic pyrophosphate present in the composition is from 100 ppm to 175 ppm based on the total weight of the composition.

* * * * *